United States Patent
Rhyee et al.

(10) Patent No.: US 10,062,824 B2
(45) Date of Patent: Aug. 28, 2018

(54) THERMOELECTRIC MATERIAL USING PHASE SEPARATION, THERMOELECTRIC DEVICE USING THERMOELECTRIC MATERIAL, AND METHOD FOR PREPARING SAME

(71) Applicants: LG ELECTRONICS INC., Seoul (KR); UNIVERSITY-INDUSTRY COOPERATION GROUP OF KYUNGHEE UNIVERSITY, Yongin-si, Gyeonggi-do (KR)

(72) Inventors: Jongsoo Rhyee, Yongin-si (KR); Yoojang Song, Suwon-si (KR)

(73) Assignees: LG ELECTRONICS INC., Seoul (KR); UNIVERSITY-INDUSTRY COOPERATION GROUP OF KYUNGHEE UNIVERSITY, Yongin-si (KR)

( * ) Notice: Subject to any disclaimer, the term of this patent is extended or adjusted under 35 U.S.C. 154(b) by 148 days.

(21) Appl. No.: 15/100,579

(22) PCT Filed: Jan. 19, 2015

(86) PCT No.: PCT/KR2015/000520
§ 371 (c)(1),
(2) Date: May 31, 2016

(87) PCT Pub. No.: WO2015/108380
PCT Pub. Date: Jul. 23, 2015

(65) Prior Publication Data
US 2016/0300992 A1 Oct. 13, 2016

(30) Foreign Application Priority Data

Jan. 20, 2014 (KR) .................. 10-2014-0006529

(51) Int. Cl.
*H01L 35/18* (2006.01)
*H01L 35/16* (2006.01)
(Continued)

(52) U.S. Cl.
CPC .............. *H01L 35/16* (2013.01); *H01L 35/04* (2013.01); *H01L 35/18* (2013.01); *H01L 35/34* (2013.01)

(58) Field of Classification Search
CPC ................................ H01L 35/16; H01L 35/18
See application file for complete search history.

(56) References Cited

U.S. PATENT DOCUMENTS 6,225,548 B1 * 5/2001 Sakakibara ............. H01L 35/16
136/201
2012/0091404 A1 4/2012 Snyder et al.
(Continued)

FOREIGN PATENT DOCUMENTS

CN 101047223 A 10/2007
CN 101960627 A 1/2011
(Continued)

OTHER PUBLICATIONS

Sharma et al, "Influence of nanostructured and heterogeneous nucleation on the thermoelectric figure or merit in AgBiTe2", Journal of Aplied Physics, 107, Jun. 14, 2010, pp. 113716-1 to 113716-8.*

(Continued)

*Primary Examiner* — C Melissa Koslow
(74) *Attorney, Agent, or Firm* — Dentons US LLP

(57) ABSTRACT

A thermoelectric material having a composition of formula $(Tl)_x(Bi_{0.5}Sb_{1.5-x}Te_{3-y})_{1-x}$, where $0 < x \le 0.4$ and $0 < y \le 0.5$.

9 Claims, 17 Drawing Sheets

(51) Int. Cl.
*H01L 35/04* (2006.01)
*H01L 35/34* (2006.01)

(56) References Cited

U.S. PATENT DOCUMENTS

| | | |
|---|---|---|
| 2012/0138115 A1 | 6/2012 | Chen |
| 2012/0248386 A1 | 10/2012 | Heremans et al. |
| 2013/0180560 A1 | 7/2013 | Venkatasubramanian et al. |

FOREIGN PATENT DOCUMENTS

| | | |
|---|---|---|
| JP | 2000-164940 A | 6/2000 |
| JP | 2004-335796 A | 11/2004 |
| JP | 2013-161989 A | 8/2013 |
| KR | 10-2011-0051814 A | 5/2011 |
| KR | 10-2012-0005630 A | 1/2012 |
| WO | 2012/005423 A1 | 1/2012 |
| WO | 2013/094598 A1 | 4/2015 |

OTHER PUBLICATIONS

Shen et al, "Influence of Ag2Te doping on the thermoelectric propeties of p-type Bi0.5Sb1.5Te3 bulk alloy", Journal of Inorganic Materuals, vol. 25, No. 6, Jun. 2010, pp. 583-587.*
Jun-Jie Shen et al., "Influence of Ag2Te Doping on the Thermoelectric Properties of p-type Bi0.5Sb1.5Te3 Bulk Alloys", Journal of Inorganic Materials, Jun. 2010, vol. 25, No. 6, pp. 583-587.
P.A. Sharma et al. "Influence of nanostructuring and heterogeneous nucleation on the thermoelectric figure of merit in AgSbTe2" Journal of Applied Physics, vol. 107, Issue 11, 113716, 2010, pp. 113716-1-113716-9.
Wei Zhang et al., Topological Aspect and Quantum Magnetoresistance of β-Ag2Te, XP080471372A, Aug. 9, 2011, pp. 1-5.
Wei Zhang et al., "Topological Aspect and Quantum Magnetoresistance of β-Ag2Te", Phys.rev.lett, vol. 106, No. 15, Aug. 9, 2011.

* cited by examiner 201   200   202

First material

Second material

THERMOELECTRIC MATERIAL USING PHASE SEPARATION, THERMOELECTRIC DEVICE USING THERMOELECTRIC MATERIAL, AND METHOD FOR PREPARING SAME

This application is a National Stage Application of International Application No. PCT/KR2015/000520, filed on Jan. 19, 2015, which claims the benefit of Korean Patent Application No. 10-2014-0006529, filed on Jan. 20, 2014, all of which are hereby incorporated by reference in their entirety for all purposes as if fully set forth herein.

TECHNICAL FIELD

The present invention relates to a thermoelectric material using phase separation, a thermoelectric device using the thermoelectric material, and a method for preparing the same.

BACKGROUND ART

The thermoelectric effect refers to a reversible and direct energy conversion between heat and electricity. The thermoelectric effect is generated by transfer of charge carriers, that is, electrons and holes in materials.

The Seebeck effect is a conversion of temperature differences directly into electricity, and has been applied to the field of power generation using an electromotive force generated due to a difference in temperature between both ends of a thermoelectric material. The Peltier effect is an effect in which heat is produced at an upper junction and absorbed at a lower junction when an electric current is allowed to flow in a circuit, and has been applied to the field of cooling systems using a difference in temperature between both ends of a thermoelectric material caused by an electric current applied from the outside. Meanwhile, the Seebeck effect and the Peltier effect differ from Joule heating in that these effects are thermodynamically reversible but Joule heating is not thermodynamically reversible.

In recent years, thermoelectric materials have been applied to passive cooling systems for semiconductor equipment and other electronic devices in which it is difficult to solve problems regarding production of heat in active cooling systems, and demand therefor has been expanded to fields in which the problems were not solved in the systems using a conventional refrigerant gas compression method, that is, precision temperature control systems applied to DNA studies. Thermoelectric cooling is an environmentally friendly cooling technique which causes neither vibration nor noise and in which no refrigerant gases causing environmental issues are used. When cooling efficiency is improved with the development of high-efficiency thermoelectric cooling materials, such thermoelectric cooling materials will expand to application fields of general cooling systems such as commercial and household refrigerators, air conditioners, etc. In addition, when a thermoelectric material is applied to automotive engine units, facilities from which a large amount of heat is released in industrial factories, etc., electricity may be generated due to difference in temperature caused between both ends of the thermoelectric material. As a result, the thermoelectric material has drawn attention as one new and renewable energy source.

DISCLOSURE

Technical Problem

An object of the present invention devised to solve the problem lies in a thermoelectric material capable of increasing the Seebeck coefficient without any loss of electrical conductivity to improve thermoelectric performance, a thermoelectric device using the thermoelectric material, and a method for preparing the same.

The technical objects of the present invention are not limited to the aforesaid, and other technical objects not described herein will be clearly understood by those skilled in the art from the detailed description below.

Technical Solution

The object of the present invention can be achieved by providing a thermoelectric material having a composition represented by Chemical Formula 1:

$$(TI)_x(Bi_{0.5}Sb_{1.5-x}Te_{3-y})_{1-x} \qquad \text{[Chemical Formula 1]}$$

wherein TI denotes a topological insulator.

In another aspect of the present invention, provided herein is a thermoelectric material having a dual-phase structure which includes a first grain composed of a predetermined material and a second grain composed of a topological insulator.

Advantageous Effects

Effects of a mobile terminal according to one embodiment of the present invention, and a method of controlling the same will be described below.

According to at least one of embodiments of the present invention, a thermoelectric material capable of increasing a Seebeck coefficient and a power factor to improve thermoelectric performance can be provided.

The effects of the present invention are not limited to the aforesaid, and other effects not described herein will be clearly understood by those skilled in the art from the detailed description below.

BEST MODE

A composition of a thermoelectric material used around room temperature (300 K) for cooling or heat pumps is generally represented by (Bi$_a$Sb$_{1-a}$)$_2$(Te$_c$Se$_{1-c}$)$_3$, and a figure of merit ZT of a polycrystalline bulk material at 300 K is approximately 1. Performance of the thermoelectric material may be determined by a figure of merit ZT value generally referred to as a dimensionless figure of merit and defined in Equation 1.

$$ZT = \frac{S^2 \sigma T}{\kappa} \quad \text{[Equation 1]}$$

In Equation 1, S denotes a Seebeck coefficient (which refers to a thermoelectric power generated due to a difference in temperature per 1° C.), σ denotes an electrical conductivity, T denotes an absolute temperature, and κ denotes a thermal conductivity. Thus, S$^2$σ represents a power factor. As represented by Equation 1, the Seebeck coefficient S and the electrical conductivity σ, that is, a power factor S$^2$σ should be increased and the thermal conductivity σ should be decreased to increase a figure of merit ZT of the thermoelectric material. However, since the Seebeck coefficient and the electrical conductivity have a trade-off relationship with each other, the Seebeck coefficient decreases when the electrical conductivity increases and vice versa, depending on a change in concentration of electrons or holes as carriers. For example, a metal having a high electrical conductivity has a low Seebeck coefficient, and an insulation material having a low electrical conductivity has a high Seebeck coefficient. Such a trade-off relationship between the Seebeck coefficient and the electrical conductivity restricts an increase in power factor.

Figure 1A:
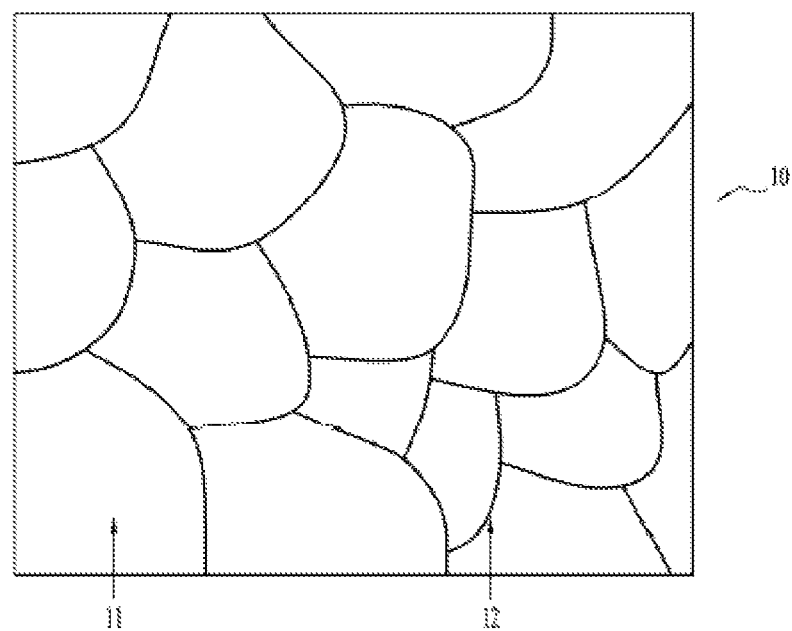
FIG. 1A to FIG. 1C are diagrams illustrating microstructures of conventional thermoelectric materials to improve a figure of merit ZT of the thermoelectric materials.
Figure 1B:
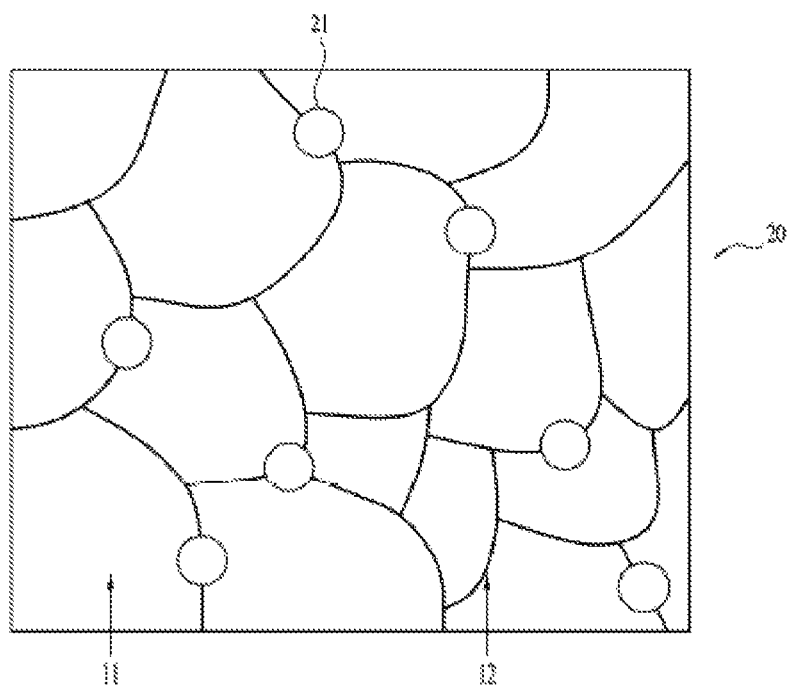
Figure 1C:
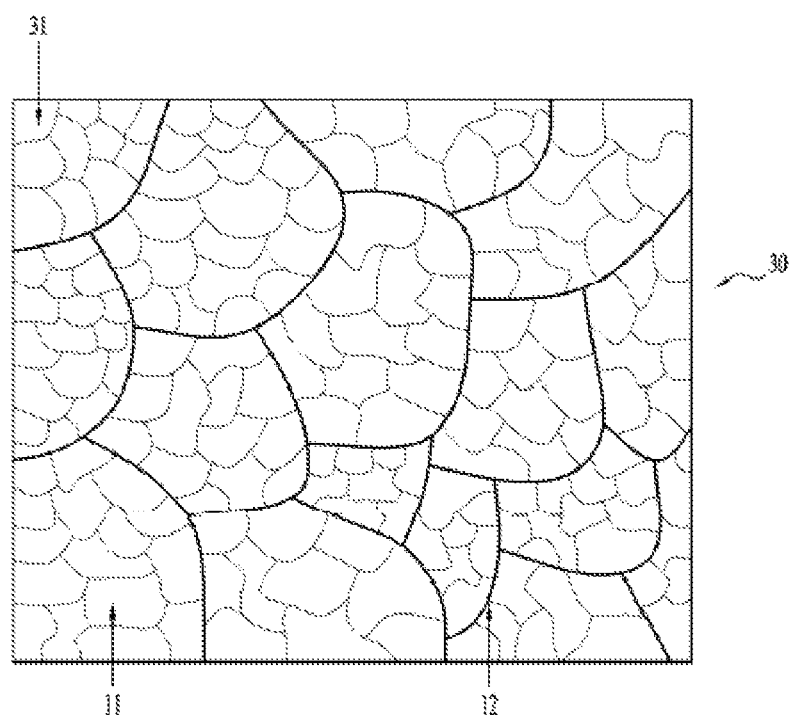

FIGS. 1A to 1C are diagrams illustrating microstructures of conventional thermoelectric materials to improve figures of merit ZT of the thermoelectric materials.

To improve the figures of merit ZT of the thermoelectric materials, there have been various attempts conducted to form nanostructures such as superlattice thin films, nanowires, quantum dots, and the like to increase the Seebeck coefficient using a quantum confinement effect or decrease the thermal conductivity based on a phonon glass electron crystal (PGEC) concept.

First, the quantum confinement effect is used as a concept in which an increase in energy density of states (DOS) of carriers in a material is caused by nanostructures to increase an effective mass, resulting in an increase in Seebeck coefficient. In this case, an interrelation between the electrical conductivity and the Seebeck coefficient collapses, and thus the electrical conductivity does not significantly increase even when the Seebeck coefficient increases.

Second, the PGEC concept is a concept in which only the thermal conductivity is lowered without any decrease in electrical conductivity by blocking movement of phonons taking part in heat transfer and preventing movement of charge carrier electrons from being blocked. That is, in the phonons and the charge carrier electrons, both of which transfer heat from a high-temperature side to a low-temperature side of the thermoelectric material, only movement of the phonons is blocked by a barrier (phonon scattering), and the charge carrier electrons flows smoothly. Therefore, such a concept has an effect of lowering thermal conductivity due to phonon scattering, but has an effect of preventing electrical conductivity from being lowered due to the charge carrier electrons.

Such conventional methods will be described in detail with reference to the drawings illustrating the microstructures of the thermoelectric materials.

FIG. 1A is a diagram illustrating a microstructure of a nanocomposite thermoelectric material 10. In the nanocomposite thermoelectric material 10, a ZT value may be increased by reducing a size of a grain 11 in the thermoelectric material. The grain 11 may have a diameter of 20 to 100 nanometers (nm).

Phonon scattering occurs when phonons pass through a grain boundary 12, thermal conductivity may be lowered with a decrease in size of the grain 11. On the other hand, since movement of the charge carrier electrons is affected at a relatively low level when the phonons pass through the grain boundary 1, a change in electrical conductivity may be minimized. Therefore, in the thermoelectric material having a nanocomposite structure, the ZT value of the thermoelectric material may be increased due to the PGEC concept, as shown in FIG. 1A.

FIG. 1B is a diagram illustrating a microstructure of an eluted thermoelectric material 20 having an increased ZT value through elution of a predetermined material 11 onto the grain boundary 12.

The material 11 eluted onto the grain boundary 12 may cause phonon scattering and simultaneously have an effect of improving electrical conductivity, thereby increasing the total ZT value of the eluted thermoelectric material 10.

FIG. 1C is a diagram illustrating a microstructure of a thermoelectric material 30 having a hierarchical structure obtained through a change in process.

The hierarchical structure serves to form another grain in the grain 11, and thus induces phonon scattering of larger phonons through the larger grain 11 and induces phonon scattering of smaller phonons through the smaller grain 31. Thermal conductivity of the thermoelectric material may be lowered through the thermoelectric material thus induced.

Microstructures of the thermoelectric materials for increasing the ZT value using conventional methods have been described so far with reference to FIGS. 1A to 1C. According to the conventional microstructures as described above, a structure for lowering thermal conductivity is commonly brought into focus. As such, a method of controlling only thermal conductivity to change the ZT value has a drawback in that a change in the ZT value may be merely slight.

As still another specific method to realize the PGEC concept, experimental results show that ZT is very significantly improved when a PbSeTe layer is formed on PbTe in a superlattice, or $Bi_2Te_3$ and $Sb_2Te_3$ layers are stacked into a superlattice. However, expensive facilities are required since a thin film process should be artificially used to form such a superlattice, and the thermoelectric materials are not suitable for actual use for thermoelectric power generation and cooling devices since the thin films have a thickness of several hundreds of nanometers even when the thin films are formed to a large thickness.

Therefore, a structure capable of reducing thermal conductivity and simultaneously improving electrical conductivity and Seebeck coefficient by means of nanostructures has been proposed as the microstructure of the thermoelectric material proposed in one embodiment of the present invention.

On major approach to reduce thermal conductivity is to realize a microstructure capable of effectively scattering phonons taking part in heat transfer through nanostructuralization, and is as described above in FIG. 1A. The grain boundary 12 is an interface effective in scattering the phonons. In this case, latticethermal conductivity may be lowered when a particle size is reduced to increase a density of the grain boundary 12. In recent years, a technique of preparing nano-sized thermoelectric material particles such as nanoparticles, nanowires, nanoplates, and the like has come to the fore as a strategy for developing such materials.

Meanwhile, since the electrical conductivity and the Seebeck coefficient have the trade-off relationship as described above, it is difficult to improve both of the electrical conductivity and the Seebeck coefficient. The trade-off relationship between the Seebeck coefficient and the electrical conductivity appears since it is difficult to adjust physical properties such as Seebeck coefficient and electrical conductivity at the same time. However, it is possible to break the trade-off relationship between the Seebeck coefficient and the electrical conductivity when a channel for realizing the Seebeck coefficient and the electrical conductivity may be divided into two channels. That is, the high Seebeck coefficient and electrical conductivity may be realized at the same time when the electrical conductivity is obtained from a sample surface and the Seebeck coefficient is given as a high value from a bulk material.

In one embodiment of the present invention, the use of a topological insulator (hereinafter also referred to as "TI") is proposed to realize the high Seebeck coefficient and electrical conductivity at the same time. The topological insulator refers to a material in which a bulk material serves as an insulator due to strong spin-orbit coupling and time-reversal symmetry but a sample surface is metallic without being topologically deformed. That is, this means that electrons move through the sample surface, a situation in which the sample surface of the insulator is metallic is referred to as a "topological metallic state." Electrical conductivity of the thermoelectric material may be improved when the electrons move through a metal layer formed on a surface of the topological insulator. Hereinafter, a specific example of the microstructure of the thermoelectric material according to one embodiment of the present invention will be described.

Figure 2:
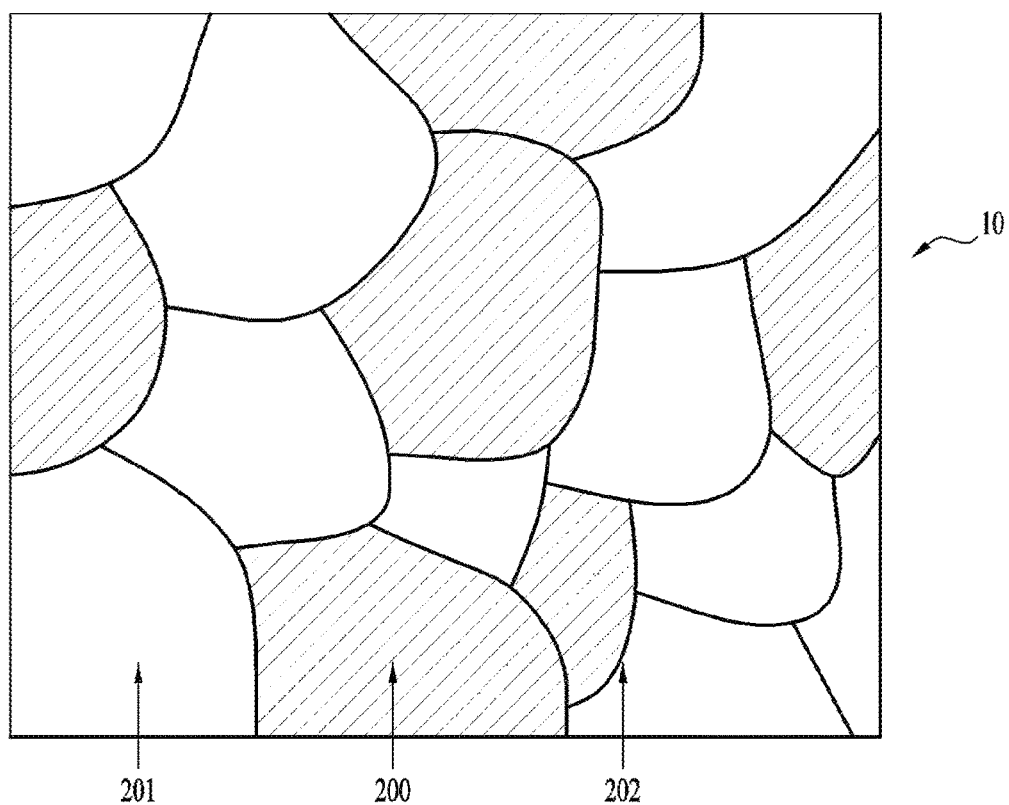
FIG. 2 illustrates a microstructure of a nanocomposite thermoelectric material having interfaces formed by different types of topological insulators according to one embodiment of the present invention.
Figure 2:
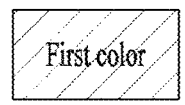
Figure 2:
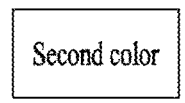

FIG. 2 illustrates a microstructure of a nanocomposite thermoelectric material having interfaces formed by different types of topological insulators according to one embodiment of the present invention.

The microstructure of the nanocomposite thermoelectric material shown in FIG. 2 may be formed through phase separation of a grain 200 (hereinafter referred to as "first grain") of a first material and a grain 201 (hereinafter referred to as "second grain") of a second material. A method for preparing the microstructure according to one embodiment of the present invention will be described in detail, as follows.

At least one of the first and second materials constituting the nanocomposite thermoelectric material according to one embodiment of the present invention may, for example, include at least one selected from the group consisting of Bi—Te-based, Pb—Te-based, Co—Sb-based, Si—Ge-based, and Fe—Si-based thermoelectric materials. The Pb—Te-based thermoelectric material contains both Pb and Te, and may also contain another element. The Co—Sb-based thermoelectric material may be a material containing Sb and one element of Co and Fe. The Si—Ge-based thermoelectric material may be a material containing both Si and Ge. More specific example of the thermoelectric materials may include $Bi_{0.5}Sb_{1.5}Te_3$, a $Bi_2Te_3$ alloy, $CsBi_4Te_6$, $CoSb_3$, a PbTe alloy, $Zn_4Sb_3$, a $Zn_4Sb_3$ alloy, $Na_xCoO_2$, $CeFe_{3.5}Co_{0.5}Sb_{12}$, $Bi_2Sr_2Co_2O_y$, $Ca_3Co_4O_9$, or a $Si_{0.8}Ge_{0.2}$ alloy. However, the thermoelectric materials are not limited to these materials.

At least one of the first and second materials according to one embodiment of the present invention may include a topological insulator.

In 2011, an article [Physical Review Letters Vol. 106, p. 156808 (2011)] of the Chinese Academy of Sciences disclosed that $\beta$-$Ag_2Te$ has topological insulator characteristics. Hereinafter, a microstructure of a topological insulator formed by phase separation of $Ag_2Te$ using a p-type thermoelectric material (i.e., $Bi_{0.5}Sb_{1.5}Se_3$) as basic material, and a method for preparing the same according to one embodiment of the present invention will be described in detail, as follows.

At least one of the first and second materials according to one embodiment of the present invention may include a semiconductor having a high energy gap.

The thermoelectric material according to one embodiment of the present invention may be used to independently control the thermal conductivity, the electrical conductivity, and the Seebeck coefficient, which leads to a significant increase in ZT value.

First, the thermoelectric material according to one embodiment of the present invention may reduce thermal conductivity by means of nanostructures thereof. As described above in the microstructure of the nanocomposite shown in FIG. 1A, the nanostructures are effective in lowering thermal conductivity since phonon scattering may be induced at the grain boundary 12. The thermoelectric material according to one embodiment of the present invention may reduce thermal conductivity by means of the nanostructures formed of the respective first and second grains.

Second, the thermoelectric material according to one embodiment of the present invention may enhance electrical conductivity through a "topological metallic state" of the topological insulator. Since a metallic state having high mobility is formed at the grain boundary 202, which may also be referred to as a surface of the topological insulator, electrical conductivity of the thermoelectric material may be very highly enhanced.

Finally, according to one embodiment of the present invention, Seebeck coefficient may be improved using a material having a high energy gap as a sample bulk material. When the Seebeck coefficient is improved, a high power factor may be expected. Since the Seebeck coefficient increases with increase in the energy gaps of the first and second materials forming the first and second grains, respectively, the Seebeck coefficient may be increased when the first and second materials are formed of an insulator. This is because the insulator is formed of a material having a high energy gap.

To form a composite having the above-described characteristics, according to one embodiment of the present invention, there is provided a thermoelectric material having a composition represented by Chemical Formula 1 by expressing topology preservation by phase separation of different types of thermoelectric materials or topological insulators (i.e., second materials) in a basic material (i.e., a first material) of the thermoelectric material ($B_{0.5}Sb_{1.5}Te_3$).

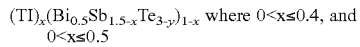

$(TI)_x(Bi_{0.5}Sb_{1.5-x}Te_{3-y})_{1-x}$ where $0<x\leq0.4$, and $0<x\leq0.5$

In Chemical Formula 1, TI denotes a "topology insulator," that is, any material having topological insulator characteristics, and thus may include at least one of $AgSbTe_2$ and $AgTe_2$. x denotes a molar ratio of the TI.

According to one embodiment of the present invention, Te may be stoichiometric ally deficient.

According to one embodiment of the present invention, Sb may be stoichiometric ally deficient.

According to one embodiment of the present invention, a compound made of the composition of Chemical Formula 1 may have a dual-phase structure in which TI and $Bi_{0.5}Sb_{1.5}Te_3$ are mixed together, as measured by X-ray diffraction (XRD).

According to one embodiment of the present invention, the thermoelectric material may have a density corresponding to 70% to 100% of a theoretical density.

Preparation Method Examples

1) Melting Phase Separation

Ag, Bi, Sb, and Te were quantitatively weighed at given molar ratios, and added into a quartz tube, and the quartz tube was vacuum-sealed at a degree of vacuum of $10^{-5}$ torr. Since $Ag_2Te$ has a melting point of 960° C., the vacuum-sealed quartz tube was put into an electric furnace, slowly heated to a temperature of 1,050 degrees Celsius (° C.), maintained at 1,050° C. for 12 hours, and then cooled. The compound thus synthesized was broken down and ground into a powder for an hour in a mortar, and the powder was sintered at a pressure of 50 MPa and a temperature of 350° C. for an hour in a carbon mold having holes with a diameter of 12.8 mm formed therein.

Figure 3:
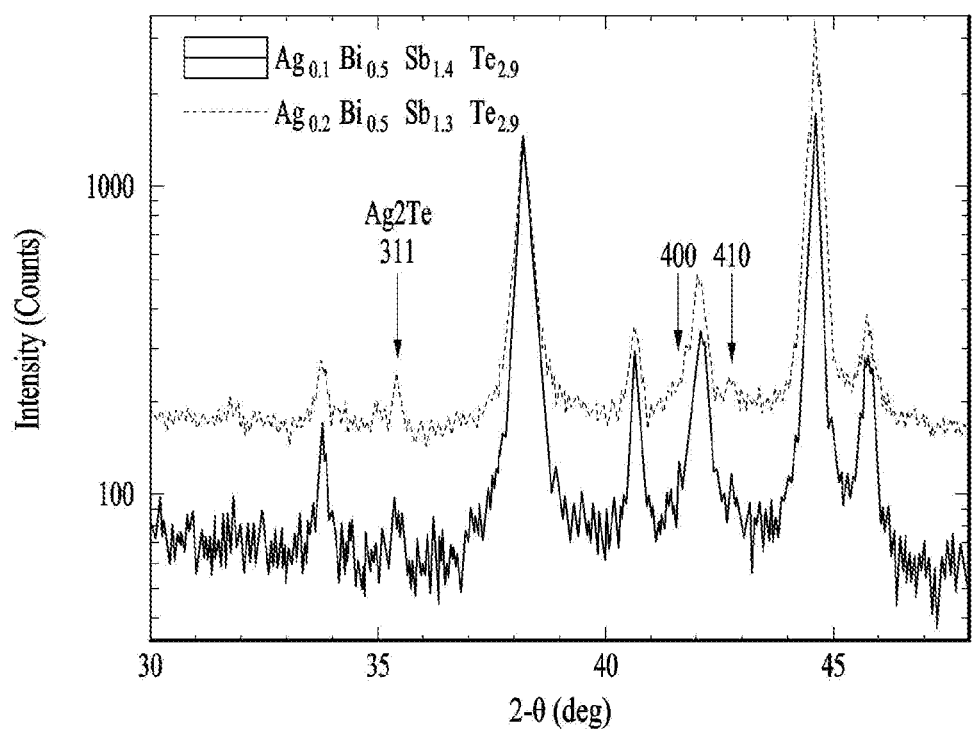
FIG. 3 illustrates X-ray diffraction (XRD) results of an $Ag_2Te$ phase phase-separated from $Bi_{0.5}Sb_{1.5}Te_3$ according to one embodiment of the present invention.
Figure 4:
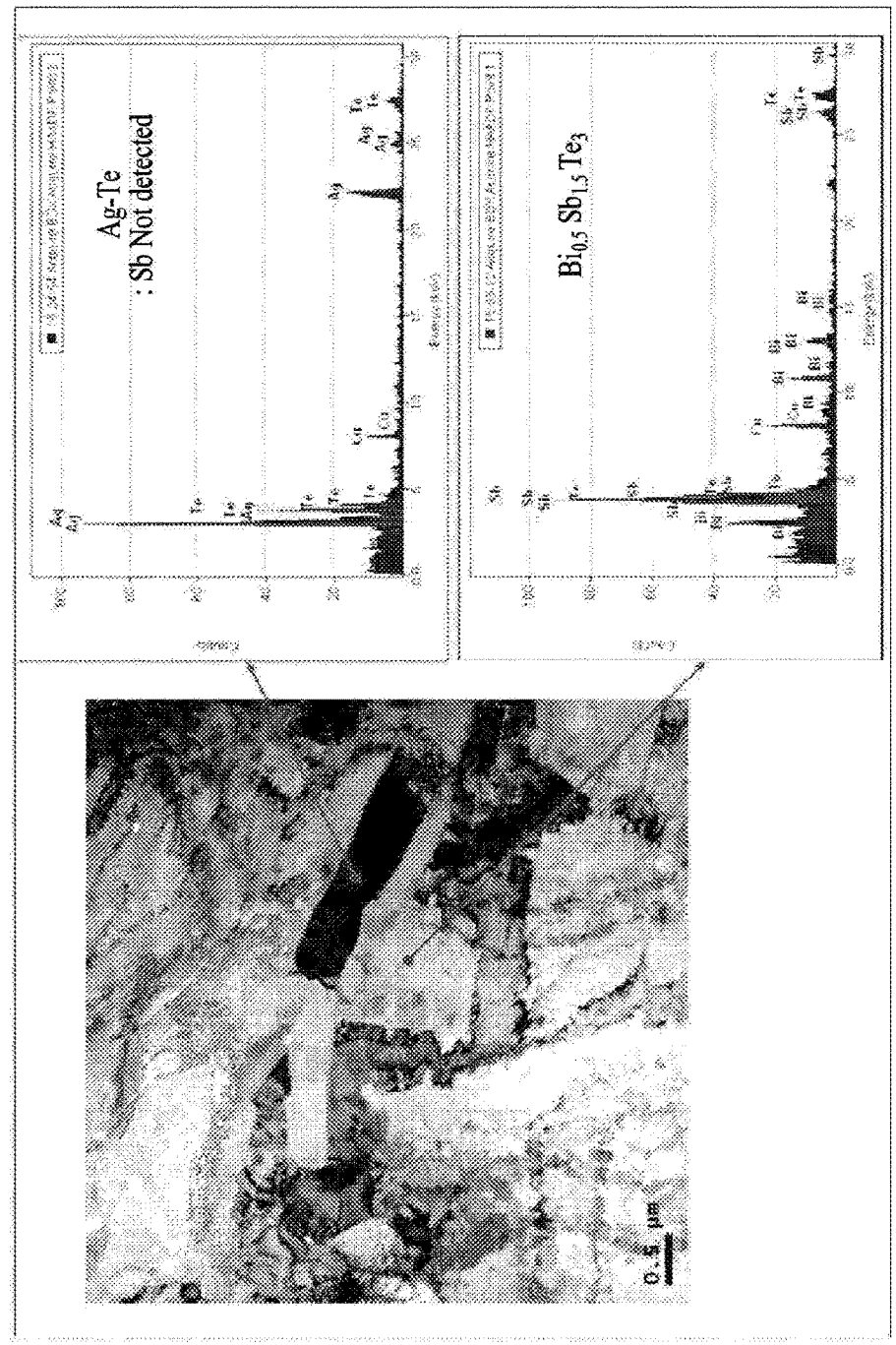
FIG. 4 illustrates high-magnification transmission electron microscope (TEM) results of the $Ag_2Te$ phase phase-separated from the $Bi_{0.5}Sb_{1.5}Te_3$ according to one embodiment of the present invention.

FIG. 3 illustrates XRD results of an $Ag_2Te$ phase phase-separated from $Bi_{0.5}Sb_{1.5}Te_3$ according to one embodiment of the present invention. FIG. 4 illustrates high-magnification transmission electron microscope (TEM) results of the $Ag_2Te$ phase phase-separated from the $Bi_{0.5}Sb_{1.5}Te_3$ according to one embodiment of the present invention.

It could be seen that $AgSbTe_2$ and $Bi_{0.5}Sb_{1.5}Te_3$ phases were separated in a sample prior to pressure sintering. As shown in FIG. 3, however, it was revealed that peaks of the $AgSbTe_2$ phase disappeared and a fine $Ag_2Te$ phase was observed in the sample pressure-sintered at 350° C., as measured by XRD. This is because the $AgSbTe_2$ phase is again phase-separated into an $Ag_2Te$ phase and an $Sb_2Te_3$ phase around 360° C. As a result, the samples in which the $Ag_2Te$ phase and the $Bi_{0.5}Sb_{1.5}Te_3$ phase were separated due to melting synthesis and pressure sintering were observed under a high-magnification transmission electron microscope, as shown in FIG. 4.

2) Powder Metallurgy $Ag_2Te$ and $Bi_{0.5}Sb_{1.5}Te_3$ compounds were synthesized separately, grinded into powders, and mixed together at a certain ratio, and the resulting mixture was then subjected to pressure sintering to prepare a composite in which two phases were mixed together.

Referring to the top panels of FIG. 4, the synthesis of $Ag_2Te$ was as follows. Ag and Te were added to a quartz tube at given molar ratios, and the quartz tube was vacuum-sealed, heated to a temperature of 1,050° C. in an electric furnace, maintained at 1,050° C. for 24 hours, and then slowly cooled to 500° C. Thereafter, the mixture was left at 500° C. for a predetermined period of time, and then quenched in water. $Ag_2Te$ thus synthesized was broken down, and ground into powder having a size of several tens of micrometers using a ball mill and a jet mill.

In addition, the synthesis of $Bi_{0.5}Sb_{1.5}Te_3$ was as follows. Bi, Sb, and Te were added to a quartz tube at given molar ratios, and the quartz tube was vacuum-sealed, heated to a temperature of 850° C. in an electric furnace, maintained at 850° C. for 24 hours, and then cooled. $Bi_{0.5}Sb_{1.5}Te_3$ thus synthesized was broken down, and ground into a powder having a size of several hundreds of nanometers using a jet mill.

The powders thus prepared were mixed at given ratios. When the powders were mixed, a small amount of $Ag_2Te$ was uniformly dispersed by a method using a ball mill, and a method of mixing the powders in an organic solvent. The resulting mixture of powders was put into a carbon mold, and then pressure-sintered at a pressure of 50 MPa and a temperature of 350° C. for an hour.

Property Evaluation

FIGS. 5A to 5E are graphs illustrating experimental results obtained by measuring electrical conductivities, Seebeck coefficients, power factors, thermal conductivities, and figures of merit ZT of the thermoelectric materials (where x is in a range of 0.1 to 0.4; x denotes a molar ratio of Ag) according to the embodiments of the present invention and the thermoelectric material ($Bi_{0.5}Sb_{1.5}Te_3$) according to the comparative embodiment. The thermoelectric characteristics were measured in a temperature range of 300 K to 600 K. The electrical conductivity was measured using a direct current (DC) 4-probe method, the Seebeck coefficient was measured using a static temperature difference method, and the thermal conductivity was measured using a laser flash method. In this case, the electrical conductivity, the Seebeck coefficient, and the thermal conductivity were all measured in a direction perpendicular to a pressing direction.

Figure 5A:
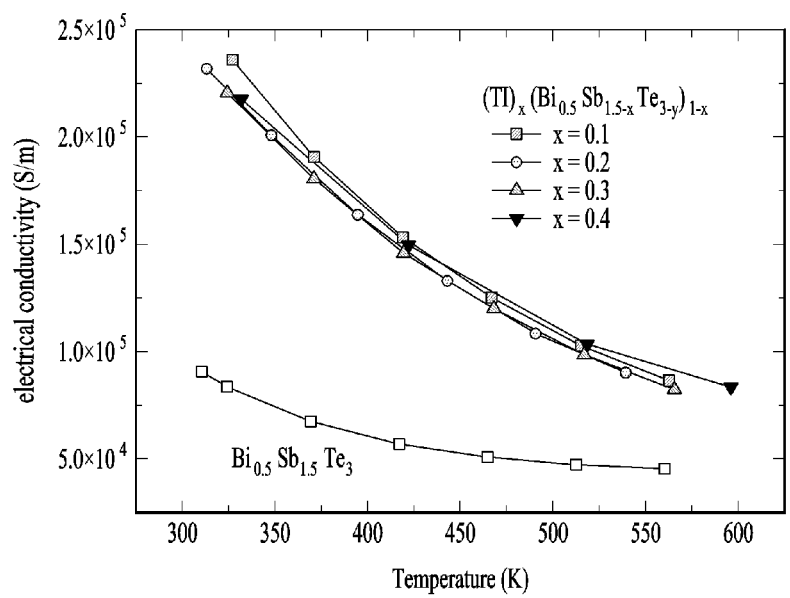
FIGS. 5A to 5E are graphs illustrating experimental results obtained by measuring electrical conductivities, Seebeck coefficients, power factors, thermal conductivities, and figures of merit ZT of thermoelectric materials (x is in a range of 0.1 to 0.4, and denotes a molar ratio of $Ag_2Te$) according to embodiments of the present invention and a thermoelectric material $(Bi_{0.5}Sb_{1.5}Te_3)$ according to a comparative embodiment according to temperatures of the thermoelectric materials.
Figure 5B:
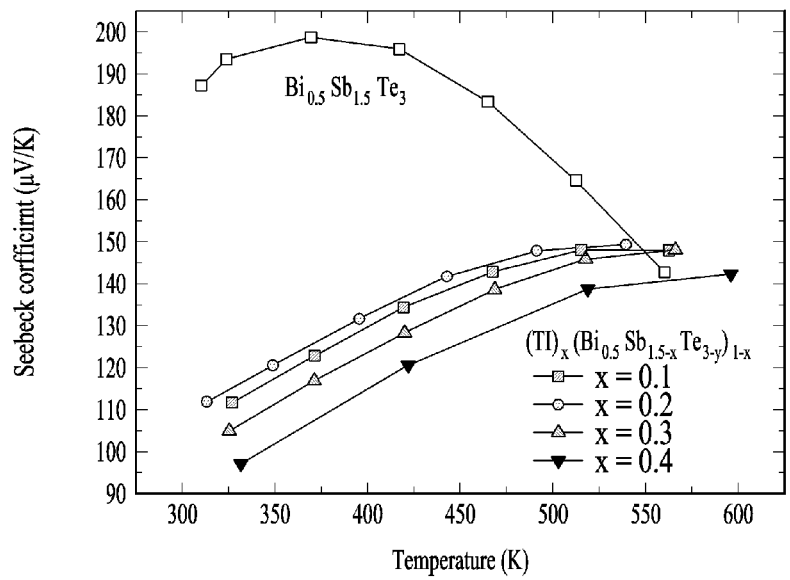

Referring to FIGS. 5A to 5E, it could be seen that the electrical conductivity values were significantly improved within an entire temperature range in the thermoelectric materials (where x is in a range of 0.1 to 0.4) according to the embodiments, compared to the thermoelectric material ($Bi_{0.5}Sb_{1.5}Te_3$) according to the comparative embodiment, and particularly that the electrical conductivity values were dramatically improved at a low temperature. Referring to FIG. 5B showing the experimental results for the Seebeck coefficient, it could be seen that the thermoelectric materials according to the embodiments of the present invention had lower Seebeck coefficient values than the thermoelectric material according to the comparative embodiment within most of the temperature range. However, it was revealed that the Seebeck coefficient values of the thermoelectric materials gradually decreased from 400 K, and were reversed at 550 K or more. In addition, it could be seen that the thermoelectric materials according to the embodiments of the present invention had the highest Seebeck coefficient values when x=0.2.

Figure 5C:
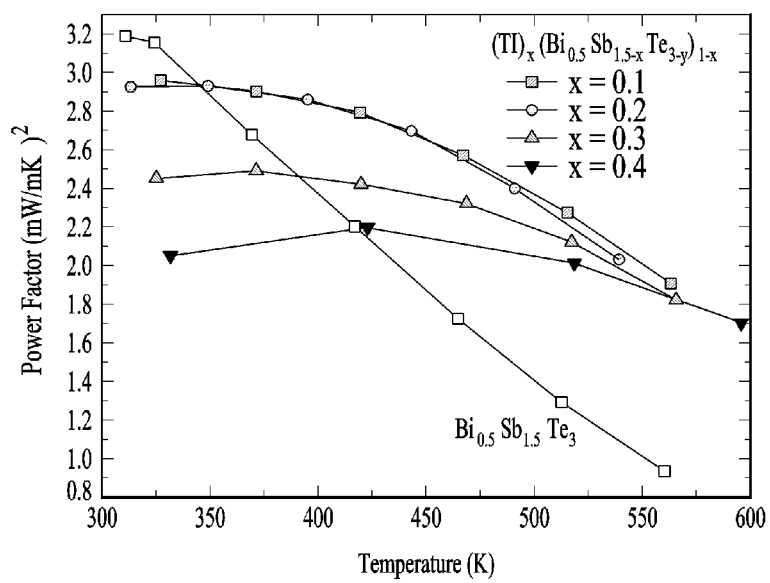

Referring to FIG. 5C showing the experimental results for the power factors, it could be seen that that the thermoelectric materials according to the embodiments of the present invention had higher power factors within most of the temperature range, compared to the thermoelectric material according to the comparative embodiment. Particularly, it was confirmed that the thermoelectric materials according to the embodiments of the present invention had the highest power factor values when x=0.1 and 0.2.

Figure 5D:
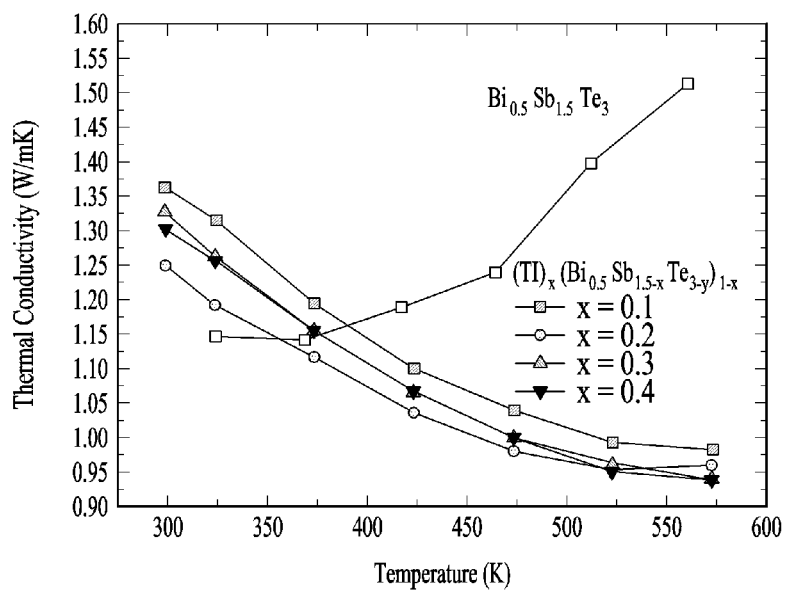

Referring to FIG. 5D showing the experimental results for the electrical conductivities, it was also revealed that the thermoelectric materials according to the embodiments of the present invention had lower electrical conductivity values within most of the temperature range, compared to the thermoelectric material according to the comparative embodiment. Particularly, it was confirmed that the thermoelectric materials according to the embodiments of the present invention exhibited the most excellent performance when x=0.2.

Figure 5E:
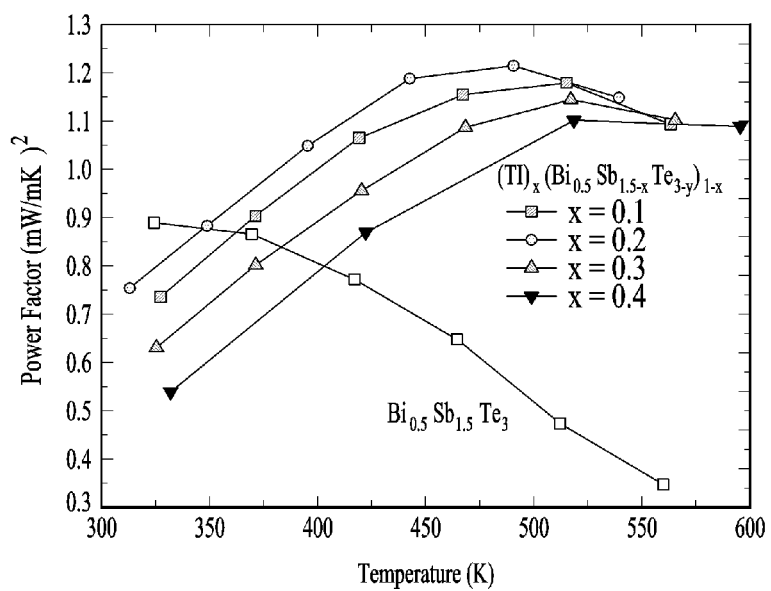

Finally, referring to FIG. 5E showing the experimental results for the figures of merit ZT of the thermoelectric materials, it was revealed that the thermoelectric materials according to the embodiments of the present invention had higher the figures of merit ZT within most of the temperature range, compared to the thermoelectric material according to the comparative embodiment. Particularly, it was confirmed that, when it was assumed that an available interval of the thermoelectric material was an interval in which the thermoelectric material had a ZT value of 1 or more, the available interval was in a range of approximately 380 K to 600 K or more when x=0.2.

Figure 6A:
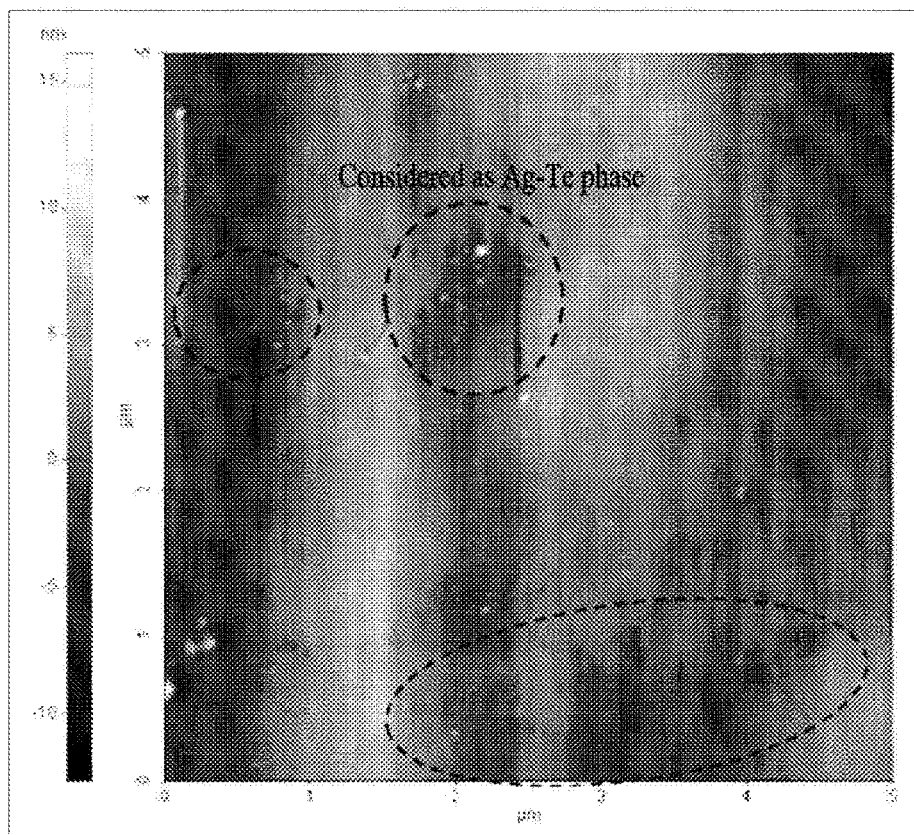
FIG. 6A illustrates a topographic image obtained by etching a section of a composite, from which $Bi_{0.5}Sb_{1.5}Te_3$ and $Ag_2Te$ phases are separated, with ion beams and taking a picture of the section using an atomic force microscope (AFM).

FIG. 6A illustrates a topographic image obtained by etching a section of a phase-separated composite with ion beams and taking a picture of the section under an atomic force microscope (AFM). In FIG. 6A, dark regions and relatively bright regions were observed due to different etching levels, indicating that the $Ag_2Te$ phase and the Bi—Sb—Te phase were mixed together in the phase-separated composite according to one embodiment of the present invention.

Figure 6B:
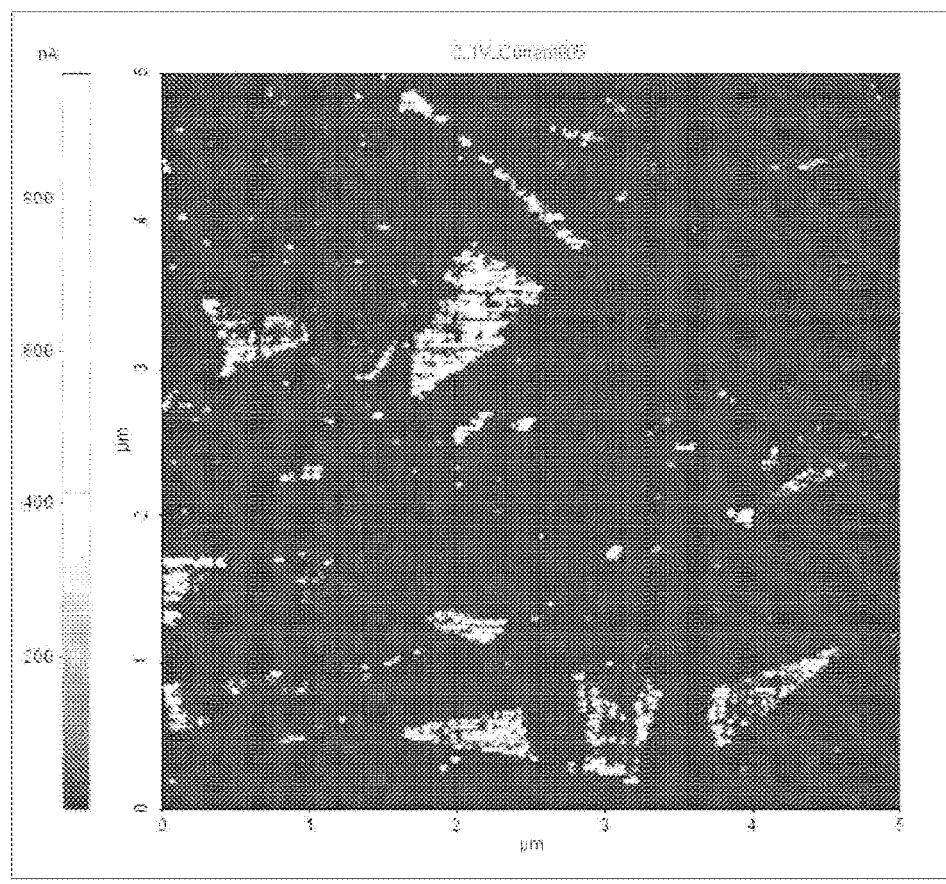
FIG. 6B illustrates a conductive AFM image of the composite.

FIG. 6B illustrates a conductive AFM image of the composite. A white region denotes a region having high electrical conductivity, and a brown region denotes a region having low electrical conductivity. That is, referring to FIG. 6B, it could be seen that the phase-separated composite according to one embodiment of the present invention had different types of phases having different electrical conductivities such that the phases were mixed together.

Figure 6C:
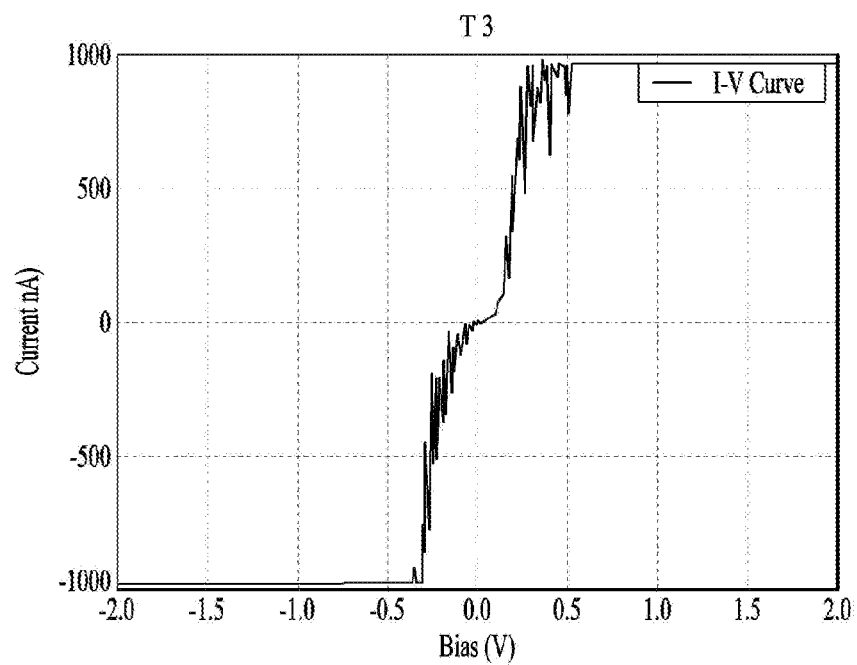
FIG. 6C illustrates an I-V characteristic curve plotted for a region considered as an Ag$_2$Te phase. In the I-V characteristic curve, the Ag$_2$Te phase exhibits semiconductive characteristics and has a small energy gap.

FIG. 6C illustrates an I-V characteristic curve plotted for a region considered as an $Ag_2Te$ phase. Referring to the I-V characteristic curve, it could be seen that the $Ag_2Te$ phase exhibited semiconductive characteristics and had a relatively small energy gap.

Figure 6D:
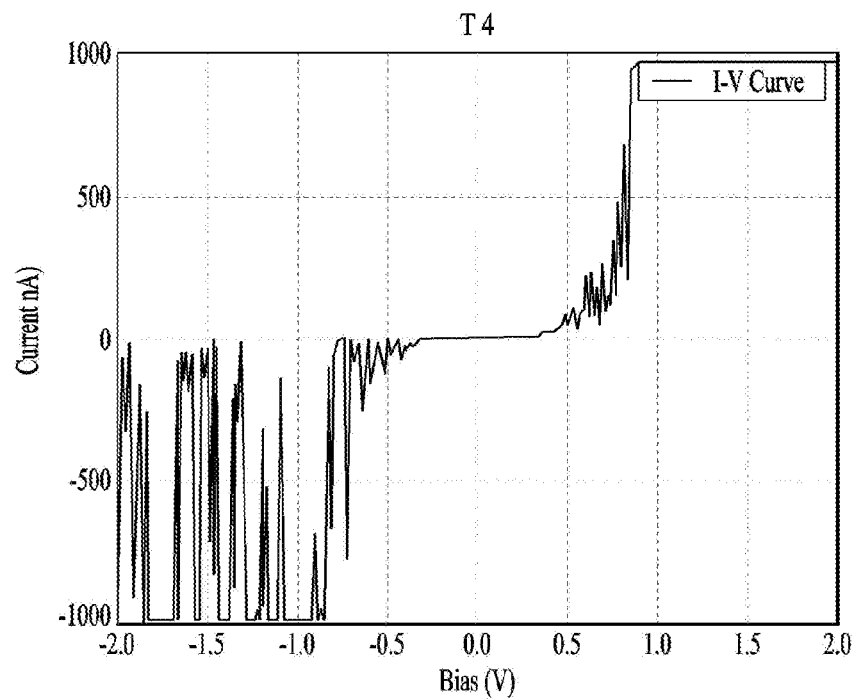
FIG. 6D illustrates an I-V characteristic curve plotted for a region assumed as a Bi—Sb—Te phase. The Bi—Sb—Te phase exhibits semiconductor characteristics in which the thermoelectric material has a higher energy gap than the Ag$_2$Te phase.

FIG. 6D illustrates an I-V characteristic curve plotted for a region considered as a Bi—Sb—Te phase. Referring to the I-V characteristic curve shown in FIG. 6D, it could be seen that the Bi—Sb—Te phase exhibited semiconductor characteristics in which such a phase had a higher energy gap than the $Ag_2Te$ phase whose energy gap was analyzed as shown in FIG. 6C.

The above-described thermoelectric material according to one embodiment of the present invention is highly applicable to various fields of industry. Hereinafter, structures of devices to which such a thermoelectric material is actually applied will be described in detail.

Figure 7:
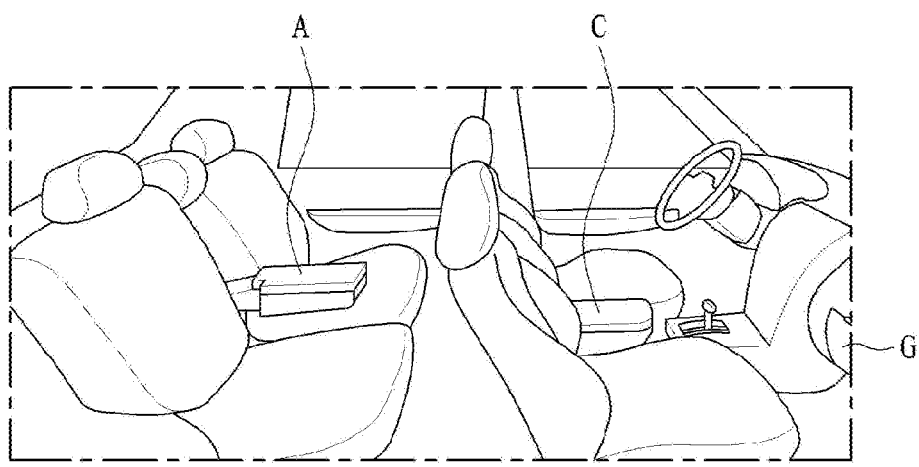
FIG. 7 is a diagram illustrating a structure of an automobile provided with a vehicle refrigerator including the thermoelectric material according to one embodiment of the present invention.

FIG. 7 is a diagram illustrating a structure of an automobile provided with a vehicle refrigerator including the thermoelectric material according to one embodiment of the present invention.

In general, a cooling/heating cabinet is installed in automobiles to hold simple beverage cans or store a small amount of foods and drinks. Such a cooling/heating cabinet is generally equipped in a glove box G positioned in front of a passenger seat, a console box C positioned in a central part of the front seat, or an inner space of an armrest A positioned in the center of a rear seat, as shown in FIG. 1.

In recent years, a thermoelectric device tends to be often used in the cooling/heating cabinet. The cooling/heating cabinet using such a thermoelectric device includes a storage chamber having an open side, a cover for opening or closing an aperture of the storage chamber, a thermoelectric device module installed at a lower portion of the storage chamber, and a duct installed outside the thermoelectric device module to absorb and radiate heat to/from the thermoelectric device module. Cooling and heating cabinet functions may be selectively used according to a flow direction of current applied to the thermoelectric device module.

Figure 8:
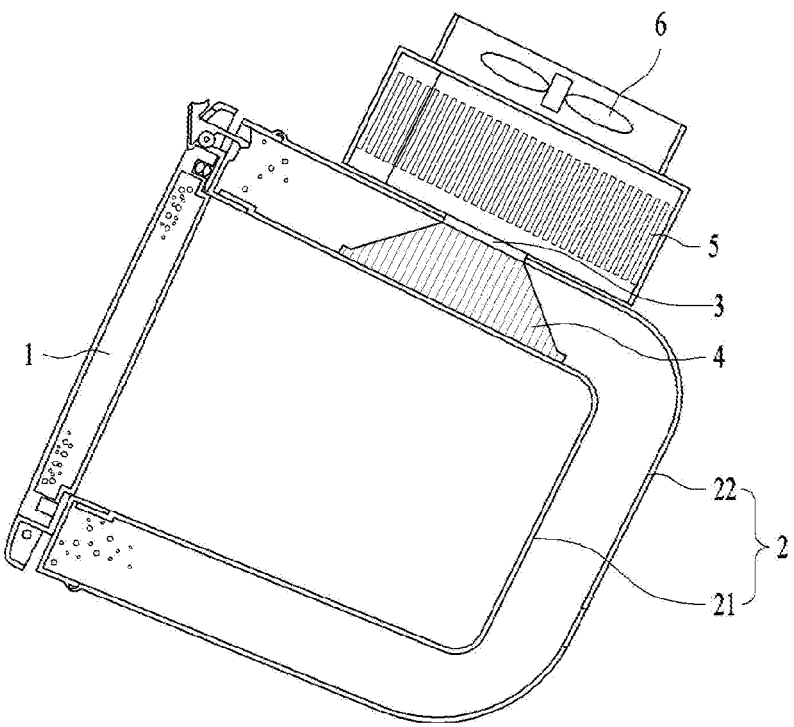
FIG. 8 is a cross-sectional view illustrating a cooling/heating cabinet which may be inserted into a glove box G in which the thermoelectric device according to one embodiment of the present invention is used.

FIG. 8 is a cross-sectional view illustrating a cooling/heating cabinet which may be inserted into a glove box G in which the thermoelectric device according to one embodiment of the present invention is used.

As shown in FIG. 8, the contents are coolly or warmly stored by a thermoelectric device module 3 installed at one side of an outer case 22 of a case 2, which includes an inner case 21 and the outer case 22, as the case 2 is opened or closed by a door 1. Such a thermoelectric device module 3 may serve to cool and heat the contents as an endothermic reaction occurs at one side of the thermoelectric device module 3 and an exothermic reaction occurs at the other side, depending on a direction of current flow. A block serving as a first heat transfer unit 4 may be arranged between the outer case 22 and the inner case 21, and may also be installed at one side of the thermoelectric device module 3 to be exposed through an inner part of the inner case 21, thereby coolly or warmly storing the contents accommodated in the inner case 21. In addition, an aluminum-based heat sink serving as a second heat transfer unit 5 may be installed at the other side of the thermoelectric device module 3. Further, a cooling fan 6 is further separately installed adjacent to the second heat transfer unit 5 to forcibly cool the second heat transfer unit 5.

Hereinafter, a structure of the cooling/heating unit including the thermoelectric device will be described with reference to FIG. 9.

Figure 9:
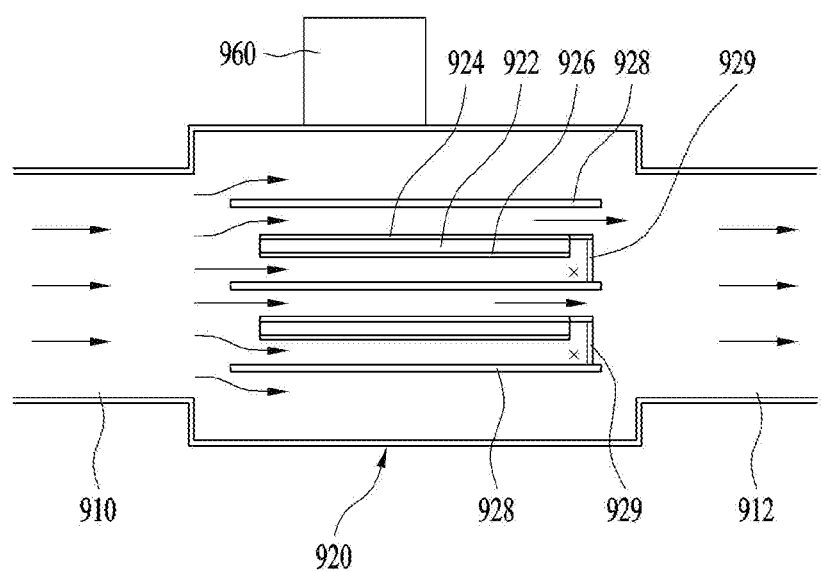
FIG. 9 is a side cross-sectional view illustrating a structure of a cooling/heating unit for vehicles including the thermoelectric device according to one embodiment of the present invention.

FIG. 9 is a side cross-sectional view illustrating a structure of a cooling/heating unit for vehicles including the thermoelectric device according to one embodiment of the present invention.

As shown in FIG. 9, a plurality of thermoelectric devices 922 are vertically arranged at the cooling/heating unit 920 at predetermined intervals. Here, first blocking plates 928 are installed above and under the thermoelectric devices 922, respectively. It is assumed that an exothermic phenomenon occurs at an upper substrate 924 disposed on the thermoelectric devices 922, and an endothermic phenomenon occurs at a lower substrate 926. This corresponds to an operation for heating.

Meanwhile, a second blocking plate 929 is installed in the rear of the thermoelectric device 922. In this case, an upper end of the second blocking plate 929 is adjacent to and coupled to a middle or upper portion of the thermoelectric device 922, and a lower end of the second blocking plate 929 is coupled to a surface of the first blocking plate 928 arranged under the second blocking plate 929.

When air is allowed to flow through an intake port 910 due to such a structure, the air moves while forming two flows of air. That is, the air passing in contact with the upper substrate 924 is heated by an exothermic phenomenon, and then discharged through the discharge port 912. However, the air passing in contact with the lower substrate 926 is cooled by an endothermic phenomenon, and then blocked by the second blocking plate 929. Therefore, the cooled air is not discharged through the discharge port 912.

The cooled air is discharged through the exhaust port 960 while moving laterally as denoted by "x" shown in FIG. 9. The exhaust port 960 may be installed to communicate with the outside of a vehicle. Although not specifically shown in the drawings, an air passage is formed along a lateral surface of the second blocking plate 929. In this case, the air passage may be configured to be coupled to the exhaust port 960, thereby separating cold air and hot air to be discharged. Although two thermoelectric devices 922 are shown in FIG. 9, it is apparent that the number of the thermoelectric devices 922 may increase using a vertical staking method, when necessary.

Hereinafter, use of the thermoelectric device according to one embodiment of the present invention to warm and cool drinking water in a purified water system will be described.

Figure 10:
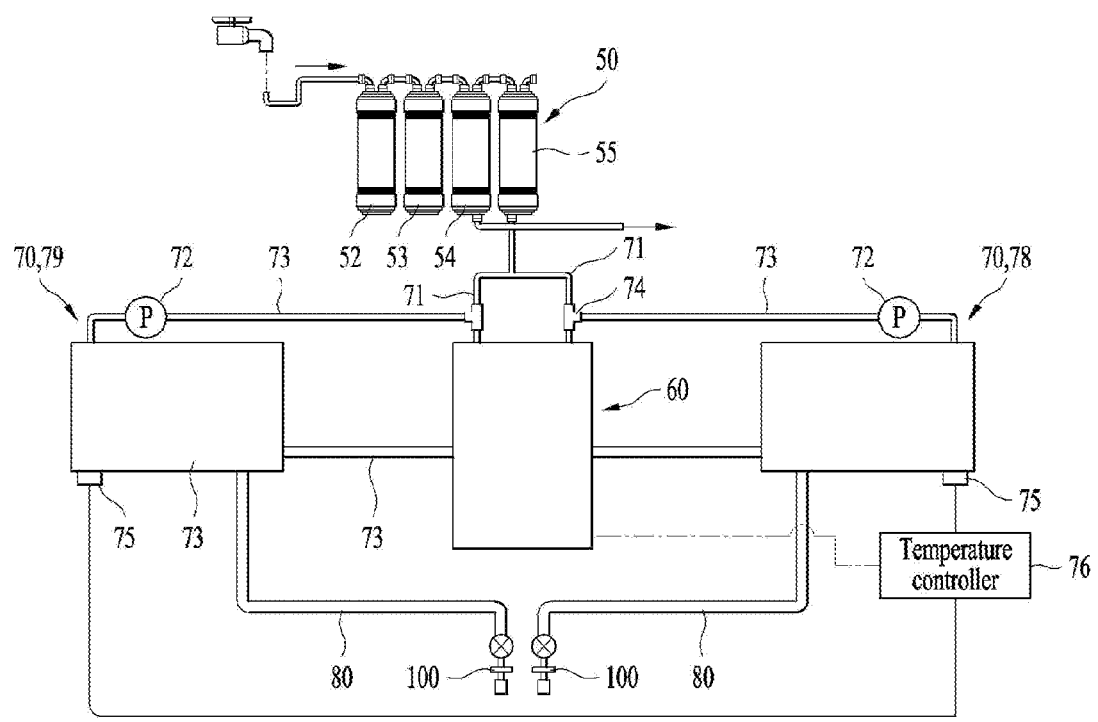
FIG. 10 is a configuration diagram illustrating a water purifier to which the thermoelectric device according to one embodiment of the present invention is applied.
Figure 11:
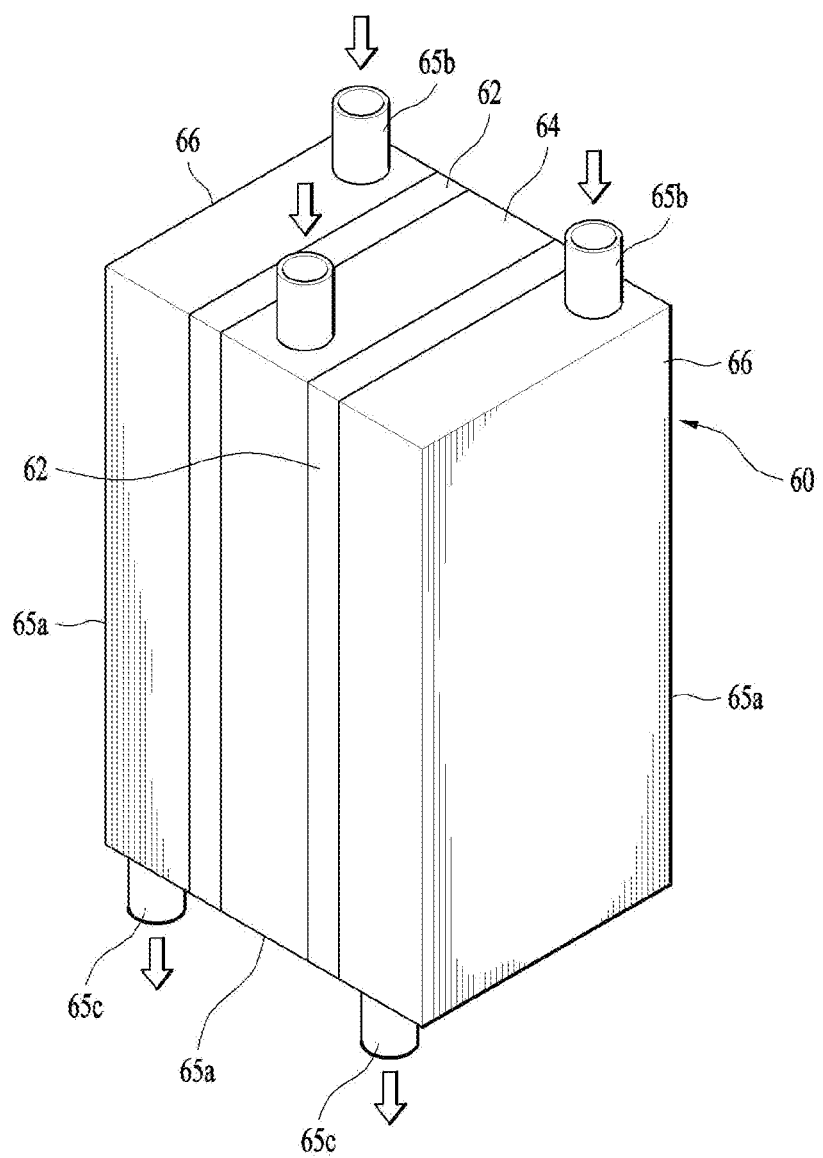
FIG. 11 is a schematic perspective view illustrating a cooling/heating module to which the thermoelectric device according to one embodiment of the present invention is applied.
Figure 12:
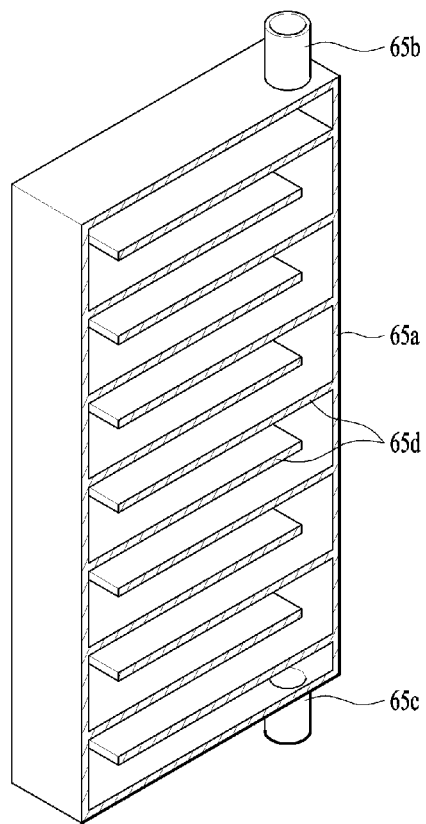
FIG. 12 is a cross-sectional view illustrating a pad according to one embodiment of the present invention.

FIG. 10 is a configuration diagram illustrating a water purifier to which the thermoelectric device according to one embodiment of the present invention is applied. FIG. 11 is a schematic perspective view illustrating a cooling/heating module to which the thermoelectric device according to one embodiment of the present invention is applied. FIG. 12 is a cross-sectional view illustrating a pad according to one embodiment of the present invention. Hereinafter, the components of the thermoelectric device according to one embodiment of the present invention will be described with reference to FIGS. 10 to 12.

As shown in FIG. 10, the water purifier according to this embodiment includes a filter module 50 for filtering water to produce purified water, a cooling/heating module 60 for cooling some of the purified water filtered through the filter module 50 using the thermoelectric effect and simultaneously heating the other purified water using the thermoelectric effect, a circulation module 70 for circulating the purified water through the filter module 50 and the cooling/heating module 60, and a discharge pipe 80 for discharging the purified water in the circulation module 70 through a discharge stopcock 100.

The filter module 50 may be used in combination with various filters, and includes a sediment filter 52, a pre-carbon filter 53, a reverse osmosis filter 54, and a post-carbon filter 55 according to this embodiment.

Here, technical configurations and operations of the sediment filter 52, the pre-carbon filter 53, the reverse osmosis filter 54, and the post-carbon filter 55, all of which constitute the filter module 50, are apparent to those skilled in the art, and detailed description thereof will thus be omitted for clarity.

The cooling/heating module 60 includes a plurality of thermoelectric semiconductors 62 including a thermoelectric device in which a cooling effect is produced at one side thereof and a heating effect is produced at the other side due to applied electric current, a cooling pad 64 closely disposed between the thermoelectric semiconductors 62 to cool the purified water filtered through the filter module 50, and heating pads 66 closely disposed outside the thermoelectric semiconductors 62 to heat the purified water filtered through the filter module 50.

The thermoelectric semiconductor 62 is formed as a thermoelectric device that is running using the Peltier effect. Here, the thermoelectric device is configured in the form of a module in which n- and p-type thermocouples are coupled so that the thermocouples are electrically arranged in series and thermally arranged in parallel. In this case, when a direct current is allowed to flow, a difference in temperature between both ends of the module is caused due to a thermoelectric effect so that one surface of the module is cooled and the other surface of the module is heated. Such thermoelectric semiconductors are environmentally friendly cooling systems replacing conventional cooling systems in which a compressor is driven to circulate a refrigerant, and may cool and heat a room-temperature subject to −30 and 180° C., respectively, using an applied electric current at the same time. Therefore, the thermoelectric semiconductors are suitable for the water purifier in which hot water and cool water are used at the same time.

Here, the two thermoelectric semiconductors 62 are used, and the cooling pad 64 is disposed between the two thermoelectric semiconductors 62 to cool the thermoelectric semiconductors 62. Although the two thermoelectric semiconductors 62 are used in this embodiment, four or six thermoelectric semiconductors 62 may be used according to an amount of purified water. In addition, the sizes and shapes of the cooling pad 64 and the heating pads 66 may vary according to the amount of the purified water.

The cooling pad 64 is closely disposed between the respective thermoelectric semiconductors 62 so that the purified water is cooled by the respective thermoelectric semiconductors 62 disposed at both sides of the cooling pad 64.

In addition, the heating pad 66 is disposed opposite the cooling pad 64 with respect to the thermoelectric semiconductors 62 so that the purified water is heated by one of the thermoelectric semiconductors 62.

As a result, when an electric current is applied to the thermoelectric semiconductor 62, one side of the thermoelectric semiconductor 62 is cooled to cool the cooling pad 64, and the other side of the thermoelectric semiconductor 62 is heated to heat the heating pads 66. In this case, the two heating pads 66, the one cooling pad 64 and the two thermoelectric semiconductors 62 are integrally formed in the form of a module.

Since the heating pad 66 and the cooling pad 64 are formed in the same structure, the cooling pad 64 will be described by way of example in this embodiment.

The cooling pad 64 includes a pad body 65a for providing a flow path for the purified water, an inlet port 65b for allowing purified water filtered through the filter module 50 to flow in the pad body 65a, and an outlet port 65c for discharging the purified water in the pad body 65a.

The inlet port 65b and the outlet port 65c are formed at the pad body 65a, a number of barriers 65d are formed in the pad body 65a, and a channel through which the purified water flows is formed due to the presence of the barriers 65d. Here, the pad body 65a may be formed of an aluminum material in this embodiment, and may also be formed of another metal material having high thermal conductivity unlike this embodiment.

The circulation module 70 serves to circulate the purified water in the water purifier while the purified water cooled or heated by the cooling/heating module 60 is not used, and includes a supply pipe 71 for supplying the purified water filtered through the filter module 50 to the cooling/heating module 60, a circulation pipe 73 for coupling the pad body 65a to the supply pipe 71 to circulate the purified water cooled or heated in the pad body 65a, a 3-way check valve 74 installed at the supply pipe 71 and coupled to the circulation pipe 73 to change passage of the purified water to one of the pad body 65a and the circulation pipe 73, and a circulation pump 72 installed at the circulation pipe 73 to circulate the purified water in the circulation pipe 73 in one direction.

The 3-way check valve 74 branches from the supply pipe 71 to be coupled to the circulation pipe 73. Here, when the purified water is not discharged through the discharge stopcock 100, the 3-way check valve 74 is opened to circulate the purified water toward the circulation pipe 73. On the other hand, when the purified water is discharged through the discharge stopcock 100, the 3-way check valve 74 is opened to supply the purified water to the cooling/heating module 60.

The circulation pump 72 may force the purified water to flow in forward and reverse directions. In this embodiment, the circulation pump 72 forces the purified water to flow toward the cooling/heating module 60 via the circulation pipe 73, and then forces the purified water to circulate through the 3-way check valve 74.

Meanwhile, according to this embodiment, the circulation module 70 may further include a temperature sensor 75 installed at the circulation pipe 73, and a temperature controller 76 for receiving data from the temperature sensor 75 to control a temperature of the cooling/heating module 60.

In addition, the discharge pipe 80 serves to couple the circulation pipe 73 to the discharge stopcock 100. In this case, when the discharge stopcock 100 is opened, the purified water in the circulation pipe 73 whose temperature is controlled is allowed to flow to the discharge stopcock 100 via the discharge pipe 80.

Meanwhile, the circulation module 70 may include a cooling circulation module 78 coupled to the cooling pad 64 to circulate cooled purified water, and a heating circulation module 79 coupled to the heating pad 66 to circulate heated purified water.

The purified water filtered through the filter module 50 is supplied to the cooling/heating module 60 via the supply pipe 71 and the 3-way check valve 74. Then, the purified water is supplied to either the cooling pad 64 or the heating pad 66 of the cooling/heating module 60.

Here, the purified water is supplied to either the cooling circulation module 78 or the heating circulation module 79 in which the purified water is deficient.

Subsequently, a control unit (not shown) of the water purifier applies a power source to the thermoelectric semiconductors 62 to cool or heat the cooling pad 64 or the heating pad 66, and the cooled cooling or heating pad 64 or 66 cools or heats the purified water flowing therein due to conduction of heat. Although the present invention has been described with reference to exemplary embodiments thereof as described above, it will be appreciated by those skilled in the art that various changes and modifications can be made to the above-described exemplary embodiments of the present invention without departing from the scope of the invention.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A thermoelectric material having a composition of Chemical Formula 1:

$$(TI)_x(Bi_{0.5}Sb_{1.5-x}Te_{3-y})_{1-x} \quad \text{[Chemical Formula 1]}$$

wherein TI denotes a topological insulator comprising $Ag_2Te$, wherein, in Chemical Formula 1, x=0.1 or 0.2 and 0<y≤0.5, and wherein the thermoelectric material has a dual-phase structure comprising a first grain composed of a material represented by $Bi_{0.5}Sb_{1.5-x}Te_{3-y}$ and a second grain composed of the topological insulator.

2. The thermoelectric material according to claim 1, wherein the thermoelectric material may have a density corresponding to 70% to 100% of a theoretical density.

3. A method for manufacturing a thermoelectric material having a composition of Chemical Formula 1:

$$(TI)_x(Bi_{0.5}Sb_{1.5-x}Te_{3-y})_{1-x} \quad \text{[Chemical Formula 1]}$$

wherein, in Chemical Formula 1, 0.1≤x≤0.4 and 0<y≤0.5, wherein TI denotes a topological insulator comprising $Ag_2Te$, comprising:

performing a melting synthesis and a pressure sintering using Ag, Bi, Sb, and Te material such that $AgSbTe_2$ and $Bi_{0.5}Sb_{1.5}Te_3$ phases are separated, and the $AgSbTe_2$ phase is further phase-separated into an $Ag_2Te$ phase and an $Sb_2Te_3$ phase.

4. The method for manufacturing a thermoelectric material according to claim 3, wherein, in Chemical Formula 1, x=0.1 or 0.2.

5. The method for manufacturing a thermoelectric material according to claim 3, which has a dual-phase structure in which TI and $Bi_{0.5}Sb_{1.5}Te_3$ are mixed together, as measured by X-ray diffraction.

6. The method for manufacturing a thermoelectric material according to claim 3, wherein the dual-phase structure comprises a first grain composed of a material represented by $Bi_{0.5}Sb_{1.5-x}Te_{3-y}$ and a second grain composed of the topological insulator.

7. A method for manufacturing a thermoelectric material having a composition of Chemical Formula 1:

$$(Ag_2Te)_x(Bi_{0.5}Sb_{1.5-x}Te_{3-y})_{1-x} \quad \text{[Chemical Formula 1]}$$

wherein, in Chemical Formula 1, 0.1≤x≤0.4 and 0<y≤0.5, comprising:

synthesizing $Ag_2Te$ and $Bi_{0.5}Sb_{1.5}Te_3$ compounds separately;

grinding the $Ag_2Te$ and $Bi_{0.5}Sb_{1.5}Te_3$ compounds into powders;

mixing the $Ag_2Te$ and $Bi_{0.5}Sb_{1.5}Te_3$ powders at a ratio given by x and y values in Chemical Formula 1; and pressure-sintering the mixture of the powders.

8. The method for manufacturing a thermoelectric material according to claim 7, wherein a small amount of $Ag_2Te$ was uniformly dispersed by a method using a ball mill.

9. The method for manufacturing a thermoelectric material according to claim 7, wherein mixing the $Ag_2Te$ and $Bi_{0.5}Sb_{1.5}Te_3$ powders is performed in an organic solvent.

* * * * *